United States Patent [19]
Inaba et al.

[11] Patent Number: 6,093,644
[45] Date of Patent: Jul. 25, 2000

[54] JIG FOR SEMICONDUCTOR WAFERS AND METHOD FOR PRODUCING THE SAME

[75] Inventors: Takeshi Inaba, Yamagata; Atsuo Kitazawa, Niigata, both of Japan

[73] Assignee: Toshiba Ceramics Co., Ltd., Tokyo, Japan

[21] Appl. No.: 09/104,539

[22] Filed: Jun. 26, 1998

[30] Foreign Application Priority Data

Jun. 26, 1997 [JP] Japan .................................. 9-187534

[51] Int. Cl.[7] .................................................. H01L 21/44
[52] U.S. Cl. .......................... 438/680; 206/710; 206/832; 414/935
[58] Field of Search ................... 206/710, 832; 414/935; 438/680

[56] References Cited

U.S. PATENT DOCUMENTS

| | | | |
|---|---|---|---|
| 4,582,561 | 4/1986 | Ioku et al. | 438/689 |
| 5,200,157 | 4/1993 | Toya et al. | 422/246 |
| 5,820,686 | 10/1998 | Moore | 118/728 |

FOREIGN PATENT DOCUMENTS

| | | |
|---|---|---|
| 62-36086 | 2/1987 | Japan . |
| 410167886 | 6/1998 | Japan . |

OTHER PUBLICATIONS

"SUSCEPTOR"; Patent Abstracts of Japan; 02212394; Aug. 23, 1990.

"PRODUCTION OF HEAT–EXCHANGER MADE OF SINTERED SILICON CARBIDE"; Patent Abstracts of Japan; 01018974; Jan. 23, 1989.

*Primary Examiner*—Richard Bueker
*Assistant Examiner*—Rudy Zervigon
*Attorney, Agent, or Firm*—Foley & Lardner

[57] ABSTRACT

The invention is aimed at reducing the influence of the pollution from impurities in the wafer to improve the wafer yield on the basis of prevention of the pollution from impurities while occurrence of slip lines in the wafer is minimized to enhance the efficiency of the surface treatment of the wafer loading faces of the vertical wafer board. For example, the surface of the jig for semiconductor wafers which is composed of the substrate of a high purity carbon is formed with a SiC film by the CVD method, said surface being ground by a grinding tool again formed of a SiC film. Hangover particles produced by said grinding operation are subjected to a high temperature oxidizing treatment to be dissolved thereafter. Application of this method to the vertical wafer board realizes that when n times of measurements are conducted for a length of Lmm in the range of $L \times n \geq 100$ mm to obtain a result that said SiC film has a maximum surface roughness Rmax. which is maintained constantly below 10 $\mu$m or less in n times of measurements while the number of particles having a size of 0.1 $\mu$m or more and adhering to the surface is reduced down to 10 pieces/mm$^2$ or less. As a result, the support by an extensive plane of the wafer loading face is assured and the influence of pollution from impurities are removed and the occurrence of slip lines is minimized.

4 Claims, 1 Drawing Sheet

JIG FOR SEMICONDUCTOR WAFERS AND METHOD FOR PRODUCING THE SAME

BACKGROUND OF THE INVENTION

The present invention relates to a jig for semiconductor wafers which is to be used in a heat treatment process in the semiconductor manufacturing and a method for producing the same, particularly to a vertical wafer board and a method for producing the same.

Conventionally, a heat treatment furnace was used for the diffusion or oxidation step of the semiconductor manufacturing, where the semiconductor wafers are subjected to a high temperature heat treatment. In this case, the semiconductor wafers placed on a wafer board which are accommodated in the furnace core tube formed of high purity silica glass such that a gas for heat treatment is introduced into the furnace core tube (process tube) for subjecting the wafer to the predetermined heat treatment.

On the other hand, there are now larger diameter wafers with the recent large scale integration of semiconductor to encourage the use of a vertical wafer board. However, when the extremities of a wafer are held in the grooves formed in the poles of the wafer board, deflections can be caused in itself due to the weight of its own and the temperature differentials throughout its plane with the result that a lack of crystal structure called "slip line" is produced in the wafer.

It is, therefore, proposed that the wafer board is provided with a wafer loading face in the form of a plane to support the wafer by means of an extensive plane of the loading face such that the formation of said "slip line" is prevented.

While vitreous glass was conventionally used as a material for such wafer board, a reaction sintered silicon carbide (SiC) material is used nowadays because high purity wafer products which are highly resistant to heat are accomplished by coating a substrate with a silicon carbide (SiC) film by chemical vapor deposition (hereinafter referred to as CVD-SiC).

However, there are still technical problems left unsolved with the vertical type reaction sintered silicon carbide (SiC) wafer board (hereinafter referred to as CVD board) which is coated with the CVD-SiC film as follows.

First, said CVD-SiC film is formed through a gas phase reaction. In this case, it is impossible to assure one hundred percent prevention of the extraordinary growth of silicon carbide (SiC) particles in the gas phase and some particles accumulate on the wafer loading face of the CVD board to form extraordinary protuberances in the loading face.

Second, suspended dust or particles in the CVD reaction tube tend to adhere to the wafer loading faces of the CVI) board before or during the CVD reaction. The silicon carbide (SiC) film is preferentially formed on such adhering dust or particles to come out in the form extraordinary protuberances in said loading faces.

Third, if utmost care is taken to prevent such formation of extraordinary protuberances by selecting CVD conditions, coarse crystallization in the CVD-SiC film results, again forming remarkable protuberances in the face.

It is known that extraordinary formation of protuberances or irregularities on the wafer loading faces causes a defect called "slip line" to occur in the backside of the wafer. The occurrence of such slip lines is remarkable in the case of a high temperature treatment step for oxidization and diffusion, thus making a major factor for lowering the heat treatment wafer yield.

According to the measurements obtained by the inventors in experiments, it is confirmed that the occurrence of the slip lines in the wafer becomes extremely conspicuous under a condition in case where the maximum surface roughness Rmax. exceeds 10 µm in n times of the surface roughness measurements in the range of L×n≧100 mm, where Lmm stands for the length to be measured and n stands for the number of the times of measurements.

This is considered due to an excessive concentration of load on the support portion in the backside of the wafer because the wafer is substantially point supported by the loading face instead of being supported by means of an extensive plane thereof.

Therefore, the inventors so far discussed methods of smoothing the wafer loading face coated with the CVD film through diamond grinding stone machining as a means for lowering the Rmax. of the wafer loading faces. However, machining by use of such a tool as a grinding stone creates a technical problem that pollution by impurities from machining by the grinding tool leads to the production of defective wafers in the oxidization and diffusion in the high temperature heat treatment process.

Further, particles of 1 µm or less produced during the machining will adhere to the wafer loading face to provide a particle source in the step, further creating a technical problem as lowering the wafer production yield in the heat treatment as a result of particle adhesion onto the wafer.

SUMMARY OF THE INVENTION

The present invention is made in order to solve the above identified problems and its object is to provide a jig for semiconductor wafers and a method for producing such jig which is able to remove the adverse effect of pollution by impurities and improve the wafer yield.

Another object of the present invention is to provide a vertical wafer board having planar wafer loading faces with an improved surface quality as a wafer loading face and the method for producing the same such that the occurence of slip lines in the wafer is minimized and the efficiency of the surface treatment of the wafer loading faces of the vertical wafer board is enhanced.

In order to accomplish the above objects, there is provided, according to the present invention, a jig for semiconductor wafers in which said jig is formed with a silicon carbide (SiC) film on a substrate thereof to provide a wafer loading face thereon, at least said wafer loading face being characterized in that when n times of measurements are conducted for a length of Lmm within a range of L×n≧100 mm to obtain a result that said silicon carbide (SiC) film has a maximum surface roughness Rmax. which is maintained constantly at 10 µm or less in n times of measurements while the number of particles having a size of 0.1 µm or more and adhering to the surface is reduced down to 10 pieces/mm² or less.

The measurement length and the number of the times of measurements can be selected on the basis of the kinds of jigs used for semiconductor wafers. Considering the preciseness of measurements conducted, the number of the times of measurement is preferably 5 times or more and even more preferably 10 times or more.

The method of producing a jig for semiconductor wafers according to the present invention, said jig has a wafer loading face, at least said wafer loading face being subjected to a treatment comprising the steps of forming a silicon carbide (SiC) film on a substrate for manufacturing the jig by applying a CVD method; grinding said silicon carbide (SiC)

film by means of a silicon carbide (SiC) tool to smooth the jig; heat treating said smoothed jig in a high temperature oxygen gas atmosphere so as to convert silicon carbide (SiC) particles produced in said silicon carbide (SiC) smoothing step and adhering to the surface of the jig into $SiO_2$; and washing said jig in a solution until the silicon dioxide ($SiO_2$) particles is dissolved therein.

Preferably, the solution to dissolve said silicon dioxide ($SiO_2$) particles includes a member selected from the group consisting of fluoric acid, a mixture of fluoric acid and hydrochloric acid, a mixture of fluoric acid and nitric acid, and a mixture of fluoric acid and sulfuric acid.

Preferably, said silicon carbide (SiC) film on the silicon carbide (SiC) jig contains 0.1 ppm or less of metal impurities therein.

The jig for semiconductor wafers according to the present invention has a silicon carbide (SiC) film formed on the surface of the substrate by the CVD method to provide a wafer loading face, at least said wafer loading face being subjected to a treatment in which said silicon carbide (SiC) film is smoothed by a silicon carbide (SiC) tool while silicon carbide (SiC) particles produced by said smoothing process to adhere to the jig surface being converted in a high temperature oxygen gas atmosphere into silicon dioxide ($SiO_2$) particles which is washed by a solution to be dissolved therewithin.

In accordance with the above jig for a semiconductor wafers and the method for producing the same, a silicon carbide (SiC) film is first formed by the CVD method on the surface of the substrate such as a reaction sintered silicon carbide (hereinafter referred to as Si—SiC). Then, the silicon carbide SiC film formed on the substrate surface is ground and smoothed by the CVD-SiC tool which is the same material as the film on the CVD board. Silicon carbide (SiC) particles produced in the grinding/smoothing operation are heat treated by in a high temperature oxygen gas flow to be all converted into silicon dioxide ($SiO_2$) particles. The resultant silicon dioxide ($SiO_2$) are washed in a solution of fluoric acid (HF) such that remaining particles are drastically reduced.

In this case, the CVD-SiC tool for grinding the silicon carbide (SiC) film formed on the surface of the substrate can be controlled such that the metal impurities contained therein is 0.1 ppm or less and it is revealed that there is no influence of pollution from impurities.

By applying this method to the wafer loading face of the vertical wafer board as a semiconductor wafer jig, it is has been revealed to be possible that the number of particles of less than 0.1 µm or less which adhere to the surface of the substrate is reduced down to 10 pieces/$mm^2$ in case where the maximum surface roughness (Rmax.) is controlled at 10 µm or less in n times of the surface roughness measurements in the range of L×n≧100 mm, where Lmm stands for the length to be measured and n stands for the number of the times of measurements.

Then, it is possible to ensure that the wafer placed on the wafer loading face is held by an extensive plane thereof to effectively reduce the occurrence of the slip in the wafer.

DETAILED DESCRIPTION OF THE EMBODIMENTS

Hereinafter, the jig for the semiconductor wafers and the method for producing the same will be explained referring to a form of embodying the invention in which the jig for semiconductor wafers is incorporated in the vertical wafer board.

Figure 1:
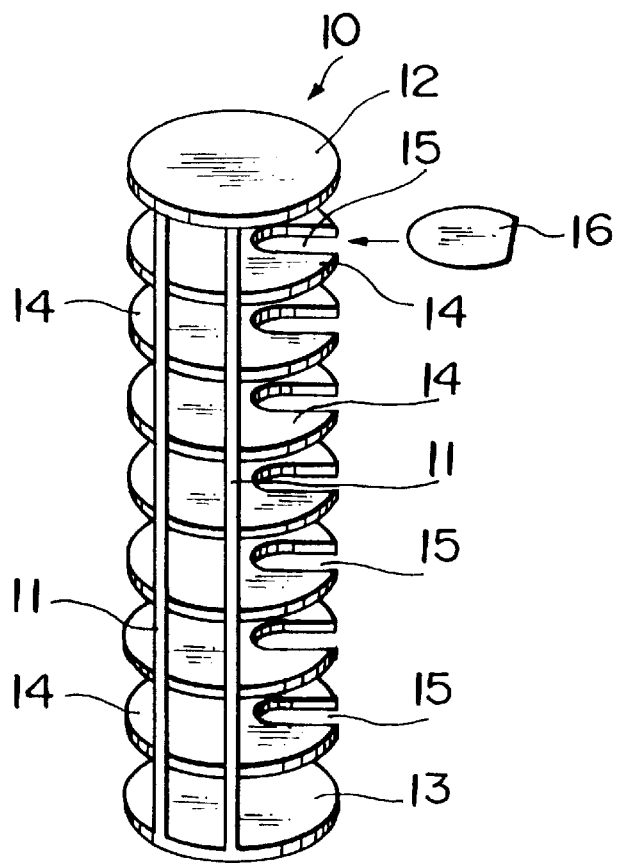
FIG. 1 is a perspective view of a jig for semiconductor wafers in the form of a vertical wafer board according to the present invention.

FIG. 1 shows a basic form of the vertical wafer board 10. In other words, a plurality of poles 11 have its upper and lower ends respectively engaged with a top board 12 and a bottom board 13 with a plurality of support boards 14 being arranged with predetermined insertion spaces therebetween. Said top board 12, said support boards 14 and said bottom boards 13 are engaged into grooves formed in said pluralities of poles 11.

Further, said respective loading boards 4 are formed with slits 15 while the upper face of each support board 14 formed with a slit 15 constitutes a loading face for a wafer 16.

Figure 2:
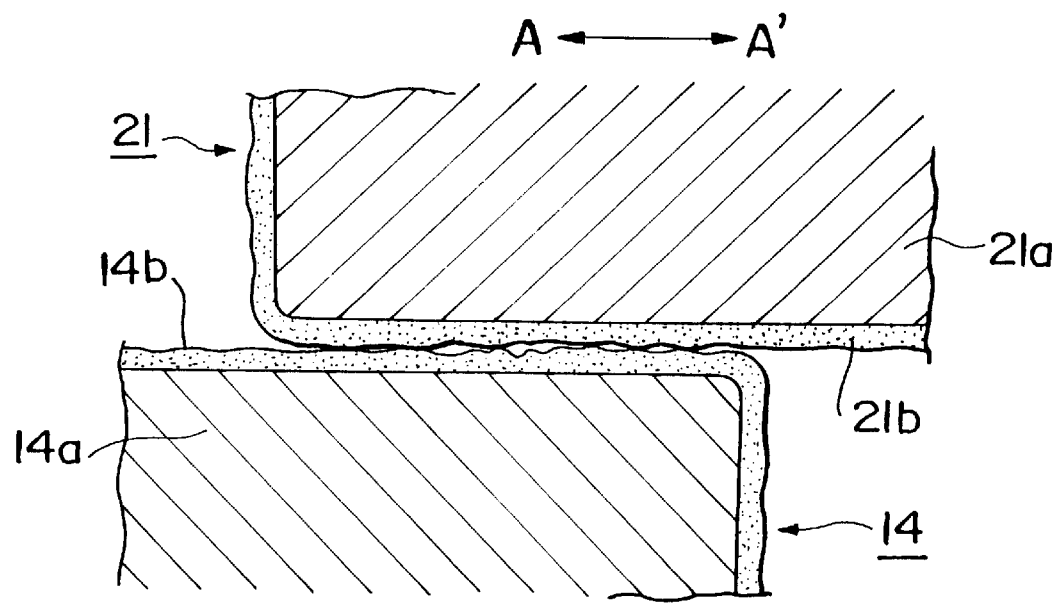
FIG. 2 is an enlarged sectional view showing a step for subjecting a wafer loading face in the vertical wafer board shown in FIG. 1 to a grinding step.

FIG. 2 shows the wafer loading face of the support board 14 being subjected to a treatment in partial cross section thereof The support board 14 is composed of a substrate 14a of, for example, Si—SiC and a silicon carbide (SiC) film 14b on the surface of said substrate 14a by the CVD method. Then, the surface of said silicon carbide SiC film 14b on the wafer loading face of the support board 14 is subjected to a grinding step by a grinding tool 21.

Said grinding tool 21 is formed of a substrate 21a for example, of high purity carbon, and a silicon carbide (SiC) film 21b formed by the CVD method on the surface of said substrate 21a. Said grinding tool 21 (hereinafter referred to also as SiC tool) is reciprocated in the direction A–A' as shown in FIG. 2 or is driven into a rotary movement in a horizontal plane such that the surface of said SiC film 14b supported by the wafer loading face of each support board 14 is subjected to a grinding operation by means of the grinding tool 21 to be smoothed.

As described in the foregoing, either the support board 14 or the grinding tool 21 is formed with silicon carbide (SiC) film on the surface of the respective substrate thereof by the CVD method, said silicon carbide (SiC) film being characterized in its ultra high purity which assures the prevention of pollution by impurities. Further, since silicon carbide (SiC) has a hardness next to diamond, its has an improved grinding efficiency.

However, the smoothing operation of the surface of the support board 14 results in the hangover of particles from the silicon carbide SiC material which is coated on the surfaces of the support board 14 and the grinding board 21.

In this way, the hangover particles adhere to the wafer loading face in numerous quantities, thus staying there as a particle source in the furnace at the time of heat treatment wafers.

As a preventive measure, the CVD board after the grinding operation is either subjected to a supersonic wave washing in ultra pure water, a boil washing, or immersed in a fluoric acid (HF) solution, all of which operations, however, failed to remove particles of the order of sub micron.

Then, the inventors came up with following methods for removing silicon carbide (SiC) particles. After the smoothing operation of said wafer support faces 14 by the grinding tool 21 is completed, the wafer board 10 is subjected to a heat treatment at a high temperature in an oxygen gas flow to accomplish the conversion of silicon carbide (SiC) to silicon dioxide (SiO$_2$) particles as shown in the following reaction formula;

$$2SiC + 3O_2 \rightarrow 2SiO_2 + 2CO$$

It is known that the silicon dioxide (SiO$_2$) particles resulted from the conversion process in the above heat treatment easily reacts with a fluoric acid (HF) solution and is dissolved thereinto.

Therefore, the wafer board 10 heat treated in the oxygen gas flow is immersed in the fluoric acid (HF) solution. As a result, substantially all of silicon dioxide (SiO$_2$) particles are dissolved into the fluoric acid (HF) solution and it was confirmed that the number of particles having the size of 0.1 μm or more remaining at the wafer loading face was reduced down to 10/mm$^2$ or less. It was also confirmed that the this is a satisfactory level in the heat treatment of the semiconductor wafers.

EXAMPLE

Twenty-two (22) units of CVD boards each having a uniform size of 8" were prepared and of said 22 CVD boards, respectively two (2) wafer boards were subjected to 11 post treatments as listed in TABLE I below.

TABLE I

| No. | Post Treatment |
|---|---|
| 1 | Not subjected to treatment (Reference) |
| 2 | The wafer loading face was machined by a conventional grinding tool (diamond). |
| 3 | The wafer loading face was subjected to treatment by the high purity silicon carbide (SiC) tool. |
| 4 | After the treatment No. 2, ultrasonic washing of the board was done. |
| 5 | After the treatment No. 2, boil washing of the board was done. |
| 6 | After the treatment No. 2, fluoric acid (HF) washing of the board was done. |
| 7 | After the treatment No. 3, ultrasonic washing of the board was done. |
| 8 | After the treatment No. 3, boil washing of the board was done. |
| 9 | After the treatment No. 3, fluoric acid (HF) washing of the board was done. |
| 10 | After the treatment No. 2, the board was subjected to heat treatment in an oxygen gas flow to be further followed by a fluoric acid (HF) washing. |
| 11 | After the treatment No. 3, the board was subjected to heat treatment in an oxygen gas flow to be further followed by a fluoric acid (HF) washing. |

(Note: Post treatment No. 11 corresponds to the present invention.)

First, each unit was destroyed for examination to see the extent of the maximum surface roughness (Rmax.) of the wafer loading face and the adhesion of particles (0.1 to 1 μm) thereonto. The (Rmax.) value was measured by means of a stylus type surface roughness profilometer (manufactured by Tokyo Precision: SURFCOM) designed under the standard JIS B 0601-1982 and the extent of particle adhesion was observed by electron microscope (SEM) to obtain the results as shown in TABLE II.

The measurement conditions of the Rmax. values in this case includes the measurement length: 10 mm, the cutoff value: 0.8 mm, the scanning speed: 0.3 mm/sec and the number of repeated measurement operations: 10 times.

There are some fluctuations in the Rmax. values depending on the machining time but it was confirmed that the Rmax. values are kept at relatively low levels in the board No. 11 which corresponds to the present invention while the particle adhesion is modest and close to No. 1 (in Comparative Example).

TABLE II

| No. | Rmax. (μm) values | Particle Adhesion (pieces/mm$^2$) |
|---|---|---|
| 1 | 8.0 to 35.0 | 0 to 5 |
| 2 | 5.5 to 12.2 | 100 or more |
| 3 | 5.8 to 13.5 | 100 or more |
| 4 | 2.2 to 7.8 | 100 or more |
| 5 | 2.3 to 7.7 | 100 or more |
| 6 | 2.1 to 7.9 | 100 or more |
| 7 | 3.6 to 9.0 | 100 or more |
| 8 | 3.7 to 8.9 | 100 or more |
| 9 | 3.5 to 9.2 | 100 or more |
| 10 | 2.0 to 7.2 | 20 to 80 |
| 11 | 3.2 to 8.1 | 0 to 4 |

(Note: No. 11 corresponds to the present invention.)

Then, there are shown in TABLE III detailed results including measured data of the Rmax. values obtained in each measurement with regard to the board No. 1 (Comparative Example) and the board No. 11 which corresponds to the present invention. The unit used in the measurement data shown in TABLE III is μm.

As clearly shown in TABLE III, out of 10 measurements there are six measurements in which the results in the Rmax. values exceed 10 μm in the Comparative Example while the results in all of the 10 measurements in the present invention are maintained below the level of 10 μm; that is, it is clear that it is at 10 μm or therebelow in the Example "the mean value+3 σ" to show that the surface is smoothed fairly uniformly.

TABLE III

| Number Measurements | Comparative Example (No. 1) | Present Invention (No. 11) |
|---|---|---|
| 1 | 9.5 | 7.2 |
| 2 | 12.4 | 5.7 |
| 3 | 35.0 | 5.4 |
| 4 | 8.0 | 3.2 |
| 5 | 21.7 | 6.5 |
| 6 | 10.4 | 5.6 |
| 7 | 11.2 | 4.9 |
| 8 | 9.3 | 8.1 |
| 9 | 29.2 | 4.6 |
| 10 | 8.8 | 4.3 |
| Mean Value | 15.55 | 5.55 |
| Standard Deviation | 9.64 | 1.44 |
| Mean Value + 3 σ | 44.46 | 9.86 |
| Minimum Value | 8.0 | 3.2 |
| Maximum Value | 35.0 | 8.1 |

Then, a wafer is loaded on a non-destructive CVD board to effect a heat treatment under conditions (1,100° C. in an oxygen gas flow for five (5) hours) on an assumption that oxidization and diffusion steps are to be undergone. For a heat treated wafer, the following subject was examined;

(1) the occurence of the slip (2) the amount of impurities on the wafer surface (MCL)

(3) the particle adhesion on the wafer surface

The subject (1) was determined by observation of oblique ray at the backside of the wafer.

The subject (2) was determined by analysis of impurities of oxidized film formed on the wafer surface.

The subject (3) was determined by the measurement with a particle counter which uses the diffusion of light.

The obtained results are listed in TABLE IV, where the integrated slip length showing the occurrence of the slips is a value obtained by summing all the slip line lengths occurring in a wafer plane.

Good results having values more favorable than those obtained with regard to No. 1 (Comparative Example) for all subjects are obtained only with regard to No. 11 (Present Invention) where a silicon carbide (SiC) tool containing fewer impurities is used, a heat treatment is effected in an oxygen gas flow and then fluoric acid (HF) washing is done.

TABLE IV

| No | Integrated Slip Length (mm/wafer) | MCL:Fe ($\times 10^{10}$ atoms/cm$^2$) | Number of Particles (pieces/wafer) |
|---|---|---|---|
| 1 | 100 to 140 | 1.0 | 0 to 10 |
| 2 | 60 to 90 | 25.0 | 25 to 40 |
| 3 | 65 to 95 | 2.0 | 20 to 35 |
| 4 | 15 to 25 | 18.0 | 20 to 35 |
| 5 | 15 to 25 | 17.0 | 20 to 35 |
| 6 | 15 to 25 | 11.0 | 20 to 35 |
| 7 | 20 to 30 | 1.8 | 15 to 30 |
| 8 | 20 to 30 | 1.6 | 15 to 30 |
| 9 | 20 to 30 | 1.3 | 15 to 30 |
| 10 | 5 to 20 | 7.0 | 10 to 25 |
| 11 | 5 to 25 | 0.9 | 0 to 5 |

(Note: No. 11 corresponds to the present invention.)

In this connection, examples will be explained with regard to the silicon carbide (SiC) tool, the heat treatment conditions in an oxygen gas flow and the washing conditions in an HF solution.

The silicon carbide (SiC) tool is formed with a CVD-SiC film on a substrate composed of said Si—SiC preferably with the maximum surface roughness of 20 to 100 $\mu$m or thereabout. Since the silicon carbide (SiC) material obtained by other than the CVD method contains impurities in the form of an auxiliary or an adhesive, the material is unsuitable to such an extent the machining efficiency drops in case outside of said range of the maximum surface roughness, thus failing to achieve the required surface quality.

The conditions for the heat treatment in the oxygen gas flow is required to be at least 1,100° C. in order to efficiently prompt the reaction in accordance with the formula shown in the foregoing. In general, the extent of the reaction speed in the formula is a function of the temperature as well as being in proportion to the square root of the time spent for treatment (to show a parabolic arc).

On this basis, all of the silicon carbide (SiC) particles of 1 $\mu$m or less are converted into silicon dioxide (SiO$_2$) if the treatment time is set at 15 hours at a temperature of 1250° C. Since particles of 1 $\mu$m or more have difficulty in adhering to the surface, the conversion thereof into silicon dioxide (SiO$_2$) is not particularly required.

The fluoric acid (HF) washing thereof has no factor which require severe control because it was confirmed that immersion of the CVD board in a solution of 10% or more for two (2) hours or more allows the silicon dioxide (SiO$_2$) particles to completely dissolve therein.

In the modes of embodying the invention and the examples described in the foregoing, the explanation has been made on the basis of the example using fluoric acid (HF). However, it has been confirmed that equivalent washing effects are obtained either by the use of the mixture of fluoric acid and hydrochloric acid, the mixture of fluoric acid and nitric acid, or the mixture of fluoric acid and sulfuric acid.

It was also confirmed that the factors such as wafer oxidization or particle diffusion brought about to the wafer by metal impurities in high temperature heat treatment to produce defective wafers were reduced since said CVD-SiC tool contains metal impurities reduced down to 0.1 ppm or less. Further, the present invention is applicable to a leaf type susceptor, a tray for transporting wafers or the like and other type of jig for semiconductor wafers for the furnace core tube.

Although it is shown in FIG. 1 that a vertical wafer board is equipped with plural leaves of wafer support boards between the top board and the bottom board of a jig for semiconductor wafers, the present invention is not limited to such specific vertical wafer board but applicable to a wafer board of general construction.

As described in the foregoing, the jig for semiconductor wafers and the method for producing the same according to the present invention is characterized in that a silicon carbide (SiC) film is formed on the surface of the substrate by the CVD method, said silicon carbide (SiC) film being smoothed by a grinding tool being formed with a silicon carbide (SiC) film thereon and then, a particle removal operation being done by the combination of a high temperature oxidization treatment and the HF washing such that said smoothing is done to the extent with the maximum surface roughness being reduced down to 10 $\mu$m while a pollution from impurities or a particle accumulation is prevented.

Therefore, the long discussed occurrence of the slip lines in the wafer is prevented, thus contributing to improving the treated wafer yield.

In this connection, while there is no advantage of controlling said slip lines in the case of a semiconductor jig which will not directly contact wafers as in the furnace core tube or the like, it is possible to contribute to the improvement in the yield of the treated wafer through the control of the pollution from impurities and particle accumulation.

What is claimed is:

1. A method of producing a jig for semiconductor wafer, said jig having a wafer loading face, at least said wafer loading face being subjected to a treatment comprising the steps of forming a silicon carbide (SiC) film on a substrate for manufacturing the jig by applying a CVD method;

grinding said silicon carbide (SiC) film by means of a silicon carbide (SiC) tool to smooth the jig;

heat treating said smoothed jig in a high temperature oxygen gas so as to convert silicon carbide (SiC) particles produced in said silicon carbide (SiC) forming step and adhering to the surface of the jig into silicon dioxide (SiO$_2$) particles washing said jig in a solution until the silicon dioxide (SiO$_2$) particles are dissolved therein.

2. A method according to claim 1, wherein said solution includes a member selected from the group consisting of fluoric acid, a mixture of fluoric acid and hydrochloric acid, a mixture of fluoric acid and nitric acid, a mixture of fluoric acid and sulfuric acid.

3. A method according to claim 1, wherein said jig contains 0.1 ppm or less of metal impurities therein.

4. A method according to claim 2, wherein said jig contains 0.1 ppm or less of metal impurities therein.

* * * * *